US012698562B2

(12) United States Patent
Herbschleb et al.

(10) Patent No.: US 12,698,562 B2
(45) Date of Patent: Aug. 4, 2026

(54) METHOD OF PARTICLE ABATEMENT IN A SEMICONDUCTOR PROCESSING APPARATUS

(71) Applicant: ASM IP Holding B.V, Almere (NL)

(72) Inventors: Cornelis Thaddeus Herbschleb, Leiden (NL); Kelly Houben, Lubbeek (BE)

(73) Assignee: ASM IP Holding B.V., Almere (NL)

( * ) Notice: Subject to any disclaimer, the term of this patent is extended or adjusted under 35 U.S.C. 154(b) by 924 days.

(21) Appl. No.: 18/046,637

(22) Filed: Oct. 14, 2022

(65) Prior Publication Data

US 2023/0127177 A1     Apr. 27, 2023

Related U.S. Application Data

(60) Provisional application No. 63/271,504, filed on Oct. 25, 2021.

(51) Int. Cl.
*C23C 16/44*        (2006.01)
*C23C 16/34*        (2006.01)
(Continued)

(52) U.S. Cl.
CPC ........ *C23C 16/4409* (2013.01); *C23C 16/345* (2013.01); *C23C 16/4404* (2013.01); *H10P 14/6334* (2026.01); *H10P 14/69433* (2026.01)

(58) Field of Classification Search
CPC ....... C23C 16/34; C23C 16/345; C23C 16/44; C23C 16/4404; C23C 16/303;
(Continued)

(56) References Cited

U.S. PATENT DOCUMENTS

2005/0130427 A1*    6/2005  Won ..................... C23C 16/4404
                                                          438/689
2006/0234518 A1    10/2006  Chen
(Continued)

FOREIGN PATENT DOCUMENTS

EP            0651435  A1     5/1995
JP          56326872  B2     3/2012
(Continued)

OTHER PUBLICATIONS

C. Cordier, E. Dehan, E. Scheid, P. Duverneuil, J. Couderc. SIPOS Deposition from Disilane: Experimental Study and Modelling. Journal de Physique IV Proceedings, EDP Sciences, 1995, 05 (C5), pp. C5-315-C5-322. [Hal achives-ouvertes.fr].
(Continued)

*Primary Examiner* — Brook Kebede
(74) *Attorney, Agent, or Firm* — Banner & Witcoff, Ltd.

(57)        ABSTRACT

A method for particle abatement in a semiconductor apparatus is provided. In a preferred embodiment, the method comprises processing a substrate in a process chamber of the semiconductor processing apparatus. The processing comprises loading the substrate in the process chamber having one or more inner surfaces, providing a reaction gas mixture to the process chamber, thereby forming a substrate film and a chamber wall film, and loading the substrate out of the process chamber. The method further comprises repeating the processing step one or more times until the chamber wall film has reached a pre-determined chamber wall film thickness, upon which exposing the inner surfaces to an ambient, thereby modifying at least an upper portion of the chamber wall film, thus reducing a probability of particle formation in the process chamber.

20 Claims, 2 Drawing Sheets

(51) Int. Cl.
H10P 14/60 (2026.01)
H10P 14/694 (2026.01)
(58) Field of Classification Search
CPC . C23C 16/4409; H01L 21/02; H01L 21/0214;
H01L 21/0217; H01L 21/02126; H01L
21/02271; H01L 21/02266; H10P 14/60;
H10P 14/6329; H10P 14/6334; H10P
14/694; H10P 14/69433
See application file for complete search history.

(56) References Cited

U.S. PATENT DOCUMENTS

2012/0064733 A1* 3/2012 Sasajima ................. C23C 16/56
257/E21.24
2012/0270722 A1 10/2012 Arnaud D'Avitaya 2014/0295676 A1* 10/2014 Suzuki ............. H01L 21/67109
118/704

FOREIGN PATENT DOCUMENTS

WO 0200962 A1 1/2002
WO 2011036353 A1 3/2011

OTHER PUBLICATIONS

H.R. Maxwell, JR and W.R. Knollw, Densification of SIPOS, Bell
Laboratories, Reading, PA, J. Electrochemical Society, vol. 128, Iss.
3, Mar. 1981, pp. 577-580.
Hidenobu Mochizuki et al., Semi-Insulating Polycrystalline-Silicon
(SIPOS) Films Applied to MOS Integrated Circuits, Jan. 1976, Jpn.
J. Appl. Phys., vol. 15, pp. 41-48.

* cited by examiner

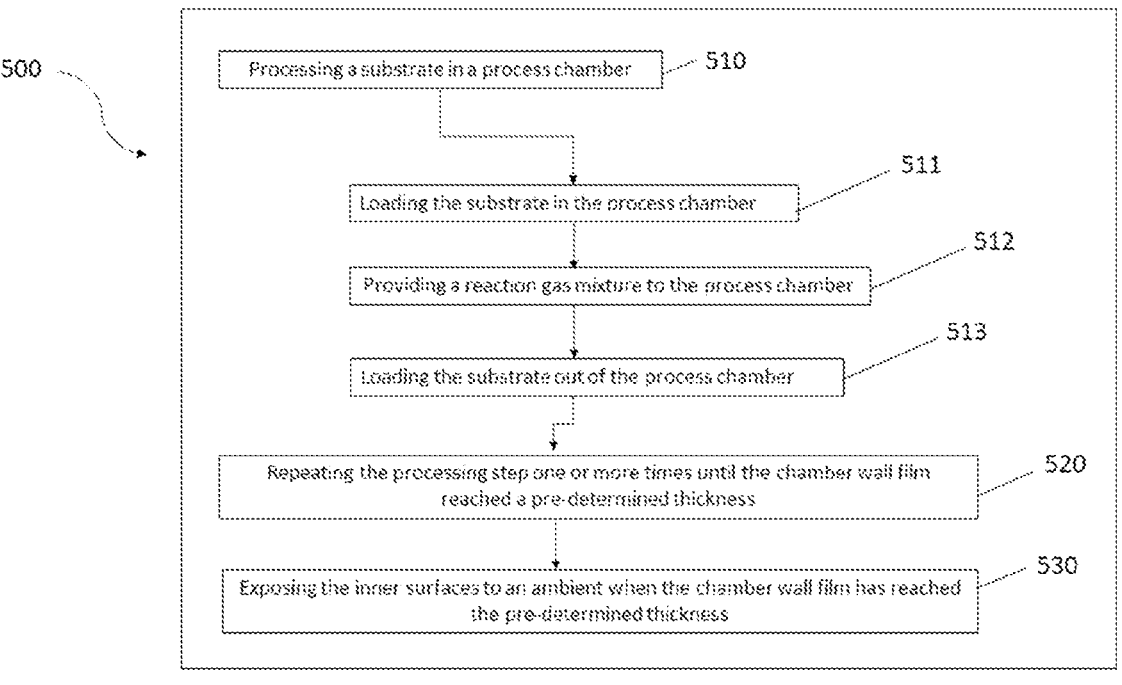
Fig. 1
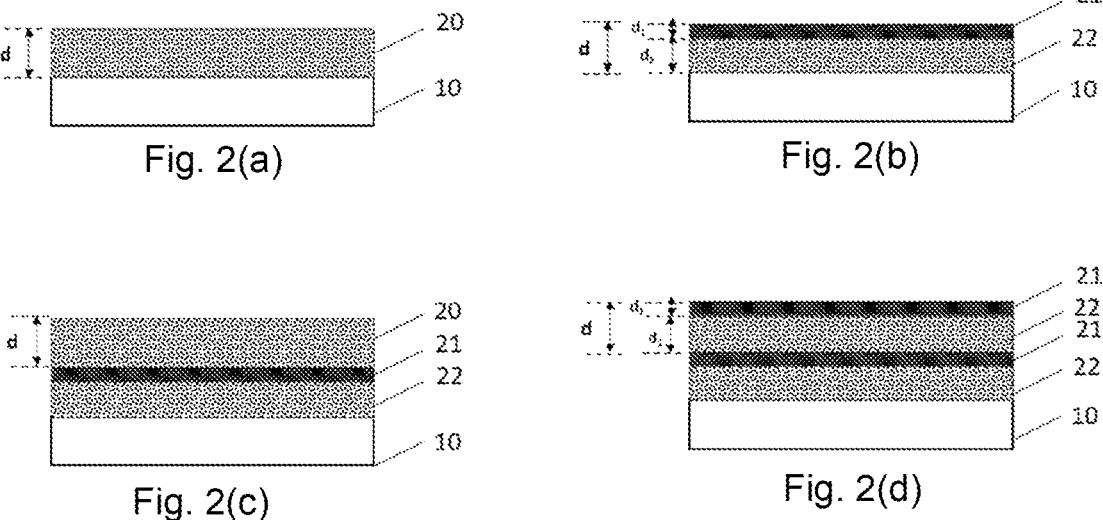
Fig. 2(a)                         Fig. 2(b)
Fig. 2(c)                         Fig. 2(d)

METHOD OF PARTICLE ABATEMENT IN A SEMICONDUCTOR PROCESSING APPARATUS

TECHNICAL FIELD OF THE DISCLOSURE

The present disclosure relates to the field of semiconductor processing. More specifically, it relates to a method of reducing particles in a semiconductor processing apparatus and to a wafer processing furnace.

BACKGROUND OF THE DISCLOSURE

Semi-insulating polycrystalline oxygen-doped silicon film, also known as SIPOS film, has been used for different applications in the semiconductor industry due to its good passivation behavior. It has been used as a replacement of thick silicon dioxide layer in metal oxide semiconductor integrated circuits (MOS-ICs), used in emitters as well as for the fabrication of high voltage semiconductor devices. SIPOS films are typically produced by Chemical Vapor Deposition (CVD). As with every other process step, production of SIPOS films may also contribute to particulate contamination.

Controlling particulate contamination has been one of the challenges in the semiconductor manufacturing. The decrease in device dimensions may put extra tension on overcoming this challenge. This may be due to the fact that many process steps are executed for submicron processing in the semiconductor fab, which is highly integrated involving many types of process equipment. Furthermore, the decrease in device dimensions may require reduction in particulate levels in order to keep up with the pre-scaling yield. Consequently, the contribution to contamination by each process step, may therefore need to decrease.

Particulate contamination not only reduces the yield of the process but can also affect the throughput adversely, thereby leading to an increase in manufacturing cost and manufacturing time.

There is, therefore, a need in the art for providing improved methods to reduce particulate formation in semiconductor processing apparatuses while minimizing the impact on throughput.

SUMMARY OF THE DISCLOSURE

It is an object of the present disclosure to provide improved methods for particle abatement in semiconductor processing apparatuses while minimizing impact on throughput. It is further an object of the present disclosure to provide a wafer processing furnace offering prolonged preventive maintenance cycle thanks to enabling particle abatement. To at least partially achieve this goal, the present disclosure may provide a method and a wafer processing apparatus as defined in the independent claim. Further embodiments of the method and the wafer processing apparatus are provided in the dependent claims.

In a first aspect, the present disclosure relates to a method of particle abatement in a semiconductor processing apparatus. This method may comprise processing a substrate in a process chamber of the semiconductor processing apparatus. The processing may comprise loading the substrate in the process chamber, the process chamber having one or more inner surfaces. It may comprise providing a reaction gas mixture to the process chamber, thereby forming a substrate film on the substrate and a chamber wall film on the one or more inner surface. It may also comprise loading the substrate out of the process chamber, thereby emptying the process chamber. The method may also include repeating the processing step one or more times until the chamber wall film has reached a pre-determined chamber wall film thickness. The method may further comprise exposing the inner surfaces to an ambient, when the chamber wall film has reached the pre-determined chamber wall film thickness, thereby modifying at least an upper portion of the chamber wall film, thus reducing a probability of particle formation in the process chamber.

The inventive method may allow for reducing the probability of particle formation in the process chamber, thereby prolonging preventive maintenance cycle. This may, in turn, lead to the advantage of reducing the number of preventive maintenance to be performed.

It may be advantageous of embodiments of the present disclosure for improving the throughput of processing in this semiconductor processing apparatus due to the reduced number of preventive maintenance to be performed.

It may further be an advantage of embodiments of the present disclosure that reliability of semiconductor devices can be improved thanks to the reduction in the probability of particle formation.

It may further be an advantage of embodiments of the present disclosure that the yield of processing in this semiconductor processing apparatus is improved thanks to the reduction in the probability of particle formation.

It may be an advantage of embodiments of the present disclosure that it leads to a reduction in manufacturing costs.

It may further be an advantage of embodiments of the present disclosure that it improves the reliability of the semiconductor processing apparatus, thereby leads to a reduction in cycle time.

It may further be an advantage of embodiments of the present disclosure that it provides setting up a good preventive maintenance plan, thereby increasing the availability of the apparatus.

In a second aspect, the present disclosure relates to a wafer processing furnace.

The wafer processing furnace may comprise a process chamber extending in a longitudinal direction and having one or more inner surfaces. It may also comprise a wafer boat for holding a plurality of substrates, the plurality of substrates being longitudinally spaced apart. It may further comprise an inlet for providing a process gas into the process chamber, wherein the one or more inner surfaces may comprise a surface layer. This surface layer may comprise a bilayer, the bilayer having a first layer comprising a semiconductor material and being overlaid by a second layer comprising an oxide, thereby prolonging preventive maintenance cycle.

It may be an advantage of embodiments of the second aspect that preventive maintenance cycle is prolonged. Prolonging the preventive maintenance cycle may offer the advantage of improving throughput of processing by this wafer processing furnace thanks to the reduced preventive maintenance interruptions to be performed.

It may be an advantage of embodiments of the second aspect that a probability of particle formation in this wafer processing furnace is reduced. This may further provide the advantage of setting up a better preventive maintenance plan for this wafer processing furnace. This may help to increase the availability of this furnace, thereby keeping processing substantially continuous.

Although there has been constant improvement in this field, the present concepts are believed to represent substantial new improvements. They also include departures from prior art practices, which lead to more improved methods and reliable apparatuses of this nature.

The above and other characteristics, features and advantages of the present disclosure will become apparent from the following detailed description, whereby the drawings herein are also considered. The drawings illustrate, by way of example, the principles of the disclosure. This description is given for the sake of example only, without limiting the scope of the disclosure. The reference figures quoted below refer to the drawings included.

Particular and preferred aspects of the disclosure are set out in the independent and dependent claims provided herein. Features from the dependent claims may be combined with features of the independent claims. They may also be combined with features of other dependent claims as appropriate and not as just set out in the claims.

BRIEF DESCRIPTION OF THE FIGURES

The above, as well as additional features and advantages of the present inventive concept, will be better understood through the following illustrative and non-limiting detailed description. Reference is also made to the drawings included. Like reference numbers will be used for like elements in the drawings unless stated otherwise.

FIG. 1: shows a flowchart of an exemplary method according to embodiments of the first aspect of the present disclosure.

FIGS. 2(*a*)-2(*d*): show a schematic representation of the step of repeating the processing step one or more times.

DETAILED DESCRIPTION OF THE DISCLOSURE

Figure 3:
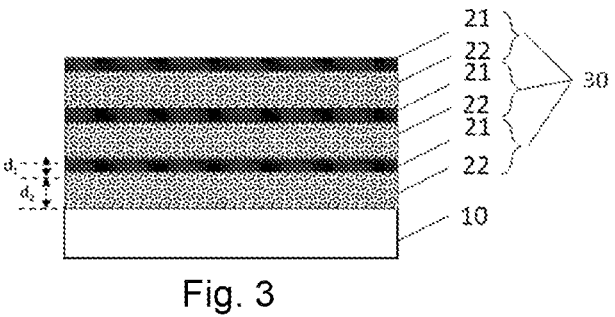
FIG. 3: show a schematic representation of the chamber wall film on the one or more inner surfaces.

The present disclosure will be described with respect to particular embodiments and with reference to certain drawings. However, the disclosure is not limited thereto but only by the claims. The drawings included are only schematic and are non-limiting. The size of some of the elements may not be drawn to scale for illustrative purposes, in the drawings. The dimensions and the relative dimensions do not correspond to actual reductions to practice the disclosure.

Reference throughout the specification to "embodiments" in various places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

It is to be noticed that the term "comprising", used in the claims, should not be interpreted as being restricted to the means listed thereafter. It does not exclude other elements or steps. It is thus, to be interpreted as specifying the presence of the stated features, integers, steps or components as referred to. However, it does not prevent the presence or addition of one or more other features, integers, steps or components, or groups thereof.

In the description provided herein, numerous specific details are stated. However, it is to be understood that embodiments of the disclosure may be practices without these specific details.

It should be appreciated that in the description of exemplary embodiments of the disclosure, various features of the disclosure are sometimes grouped together in a single embodiment, figure or description, in order to help in the understanding of one or more of the inventive aspects. The claims following the detailed description are incorporated into the detailed description, with each claim standing on its own as a separate embodiment of the disclosure.

Some embodiments described herein include some but not other features included in other embodiments. However, combinations of features of different embodiments are meant to be within the scope of the disclosure, and form different embodiments, as would be understood by those in the art. For example, in the following claims, any of the claimed embodiments can be used in any combination.

The following terms are provided solely to aid in the understanding of the disclosure.

As used herein and unless provided otherwise, the term "substantially continuous" refers to being continuous at a higher percentage in a given amount of time than being discontinuous within that same amount of time.

As used herein and unless provided otherwise, the term "comprises substantially" refers that further components than those specifically mentioned can, but not necessarily have to, be present, namely those not materially affecting the essential characteristics of the material, compound, or composition referred to.

As used herein and unless provided otherwise, the term "wafer boat" refers to a device for holding a plurality of wafers.

The disclosure will now be described by a detailed description of several embodiments of the disclosure. It is to be understood that other embodiments of the disclosure can be configured according to the knowledge of persons skilled in the art without departing from the technical teaching of the disclosure, the disclosure being limited only by the terms of the claims included.

A flowchart of an exemplary method according to embodiments of the first aspect of the present disclosure is given in FIG. 1, while a schematic representation of the step (520) of repeating the processing step one or more times is given in FIG. 2(*a*).

The presently disclosed method is especially suitable in the context of simultaneously forming polysilicon film, for example, semi-insulating polycrystalline oxygen doped silicon, on a plurality of substrates, in which particle formation after executing a particular number of deposition runs can be a particularly significant problem.

The method (500) may comprise processing (510) a substrate in the process chamber of the semiconductor processing apparatus. In embodiments, this wafer processing apparatus may be a vertical or a horizontal apparatus. In embodiments, the vertical wafer processing apparatus may be a vertical furnace. Vertical furnaces may provide the advantage over horizontally oriented furnaces of saving up space in the cleanroom. This vertical furnace may, in embodiments, be a Chemical Vapor Deposition (CVD) furnace. In embodiments, this CVD furnace may be a Low Pressure Chemical Vapor Deposition (LPCVD) furnace. Reduced pressure applied in the LPCVD furnace may provide the advantage of reducing undesirable gas-phase reactions and improve film uniformity across the substrate.

In embodiments, the substrate may be a semiconductor substrate. This semiconductor substrate may, in embodiments, be a Si (111) substrate or a Si (100) substrate. In embodiments, the substrate may comprise a semiconductor layer. This semiconductor layer may, in embodiments, be a Si (111) layer or a Si (100) layer. This semiconductor layer may have a main surface. This main surface may comprise a layer. In embodiments, this layer comprised in the main surface may be an oxide layer. This oxide layer may be a native silicon oxide, which may then be removed by processes known to persons skilled in the art, such as a hydrogen bake.

This processing (510) may comprise loading (511) the substrate in the process chamber. This process chamber may have one or more inner surfaces. This processing (510) may also comprise providing a reaction gas mixture (512) to the process chamber, thereby forming a substrate film on the substrate and a chamber wall film (20) on the one or more inner surfaces (10). The substrate may then be loaded out of the process chamber (513), thereby emptying the process chamber.

In embodiments, this process chamber may be comprised in a processing apparatus for processing a plurality of substrates arranged in a wafer boat. This may provide the advantage of providing improved throughput for wafer processing as it allows for the processing to be done in a single process run. This improvement in throughput may further have an effect on improving the overall throughput of the semiconductor manufacturing process. This may further be advantageous for reducing cost of wafer manufacturing.

In embodiments, the formation of the film, on the inner surfaces may be monitored when the process chamber is empty. This may provide the advantage of obtaining chamber wall film thickness after completion of every processing of the substrate.

The method (500) may further comprise repeating (520) the processing step one or more times until the chamber wall film (20) has reached a pre-determined chamber wall film thickness (d) (FIG. 2(a)). Therefore, the repetition of the processing (520) step one or more times may provide the advantage of following the progress of the thickness of the chamber wall film (20) occurring as a result of each processing until the pre-determined chamber wall film thickness (d) is reached.

In embodiments, the repetition of the processing step (520) may comprise obtaining the thickness of the chamber wall film (20) until it reaches the pre-determined chamber wall film thickness (d). The obtaining of the chamber wall film thickness (20) may be done in alternative ways.

One alternative of obtaining may, in embodiments, comprise calculating the chamber wall film thickness (20) after each processing. The calculation may be based on the process carried out in the process chamber. The calculation may be executed by a software integrated within the hardware of the semiconductor processing apparatus when the substrate film thickness per process is inputted. Therefore, the software may be configured for keeping track of the thickness of the substrate film that is expected to be deposited after each processing of the substrate in the process chamber. A cumulative substrate thickness value as a function of the processing of the substrate may then be obtained. It may be assumed that after each processing, the substrate film thickness increase and the chamber wall film thickness increase is the same. Thus, the cumulative thickness value may then be correlated with the expected thickness of the chamber wall film formed on the one or more inner surfaces of the process chamber.

Additionally or alternatively, obtaining the chamber wall film thickness (20) increase during a processing step can comprise receiving a numerical thickness indicator. The numerical thickness indicator may, for example, be obtained from an I/O terminal that is arranged to receive numerical input from an operator. Exemplary I/O terminals include keyboards, touchscreens, joysticks, buttons, handles, and the like.

Another alternative may comprise monitoring the presence of particles in the process chamber each time the processing of the substrate is completed. It may further comprise obtaining the thickness of the chamber wall film (20) at a moment when the presence of particles has, for the first time, exceeded a threshold value, the measured thickness then corresponding to the pre-determined chamber wall film thickness (d).

When the chamber wall film (20) has reached the pre-determined chamber wall film thickness (d), the method (500) may further comprise exposing (530) the inner surfaces to an ambient, thereby modifying at least an upper portion (21) of the chamber wall film (20), (FIG. 2(b)) thus, reducing a probability of particle formation in the process chamber. The thickness $(d_1)$ of the at least modified upper portion (21) may correspond to a thickness value that is lower than that of the pre-determined chamber wall film thickness (d). When at least the upper portion of the chamber wall film (20) is modified, the rest of the chamber wall film (22) remains unmodified and may have a thickness $(d_2)$ being lower than that of the thickness (d) of the chamber wall film (20) before modification. It is, however, to be understood that, in some embodiments, the complete chamber wall film (20) may be modified as a result of exposure to the ambient.

The exposure of the inner surfaces to the ambient (530), may in embodiments, be done when the process chamber is empty. This may allow for modifying at least an upper portion of the chamber wall film only and may thus, prevent at least an upper portion of the substrate film from getting modified as a result of the exposure to the ambient. It is, however, to be understood that methods may exist that allow for only modifying the at least upper portion of the chamber wall film while the process chamber is still loaded with the substrate or loaded with the plurality of substrates. In this case, exposure of the inner surfaces to the ambient may be configured such that exposure of the substrate, or the plurality of substrates, to the ambient is de-coupled from the exposure of the inner surfaces to the ambient, so that an upper portion of the substrate film is not modified.

Exposing the inner surfaces to the ambient when the semiconductor processing apparatus does not contain any substrates can advantageously prevent modification of an upper portion of the substrate film.

Without wishing to be bound by theory, it can be stated that the pre-determined chamber wall film thickness (d) of the chamber wall film (20) when the inner surfaces are exposed to an ambient may represent a critical thickness value, beyond which thickness-induced stress release can occur in the chamber wall film (20), thereby leading to the formation of particles in the process chamber. This may be related to the fact that as the thickness of the chamber wall film (20) is increased, the stress in the film may also change. This pre-determined chamber wall film thickness (d) may thus, have the advantage of providing this critical value for thickness, beyond which particle formation would occur in the process chamber. By modifying the at least an upper portion of the chamber wall film upon reaching this pre-determined chamber wall film thickness (d), the build-up of the chamber wall film (20) on the inner surfaces is interrupted. After modification of at least the upper portion of the chamber wall film (20), the processing step (510) may, in embodiments, be repeated one or more times until each time the pre-determined chamber wall film thickness (d) is reached (FIG. 2(*b*) to FIG. 2(*d*)). After reaching the pre-determined chamber wall film thickness (d) each time, exposure of the inner surfaces to the ambient (530) may be repeated, thereby modifying the at least upper portion of the newly formed chamber wall film. This may then provide the advantage of allowing build-up of the chamber wall film without running the risk for the occurrence of thickness-induced stress release. This may lead to the presence of a chamber wall film on the inner surfaces having portions (22) of incremental thickness ($d_2$) that are laminated with the modified portions (21). After executing these repetitive processing steps for a pre-determined number of times, thereby forming the chamber wall film on the inner surfaces having portions (22) of incremental thickness ($d_2$) that are laminated with the modified portions (21), a preventive maintenance may be executed to clean the inner surfaces.

Reducing the probability of particle formation in the process chamber may provide the advantage that it allows for prolonging preventive maintenance cycle. This may, in turn, lead to the advantage of reducing the number of preventive maintenance to be performed. Reduction in the number of preventive maintenance may, in turn, provide the advantage of improving the throughput of the processing. This may be due to the lower number of preventive maintenance interruptions to be done on the apparatus, thereby increasing process apparatus availability and keeping processing substantially continuous.

Reducing the probability of particle formation in the process chamber may also provide the advantage of setting up a better preventive maintenance plan, thereby also increasing process apparatus availability and keeping processing substantially continuous. Setting up a better preventive maintenance plan may also provide the advantage of reducing the risk for unplanned downtime of the semiconductor processing apparatus that might be due to unplanned downtime caused by the failure of the apparatus.

Particle formation occurring in a process chamber may be one of the important sources of contamination that may jeopardize the reliability of semiconductor devices. Thanks to the present disclosure, by reducing the probability of particle formation, the reliability of semiconductor devices may be improved. Furthermore, as particle formation and consequently their incorporation into the substrates may lead to the formation of defects, reduction in the probability of particle formation may provide the advantage of reducing defect formation and thereby, improving the yield of processing. Defect formation at any stage of semiconductor processing may have adverse effects on the functioning and reliability of the semiconductor devices made.

Reducing the probability of particle formation in the process chamber may also provide the advantage of improving the reliability of the semiconductor processing apparatus, thereby leading to a reduction in cycle time. Reduction in cycle time may particularly be advantageous as device scaling is continuing, which necessitates the semiconductor fab becoming highly integrated and involving many types of semiconductor process apparatuses.

In embodiments, the film may have a first chemical nature and wherein the modified upper portion of the film may have a second chemical nature being different than the first chemical nature. The film with the first chemical nature refers to both the substrate film formed on the substrate and the chamber wall film formed on the chamber wall as a result of the provision of the reaction gas mixture to the process chamber. The second chemical nature, on the other hand, pertaining to the at least modified upper portion of the film refers only to the chemical nature of the at least modified upper portion of the chamber wall film. It is to be understood that the second chemical nature of the at least modified upper portion may, in embodiments, be a result of a chemical change, whereby the film having the first chemical nature may lose its identity. The difference in the first and the second chemical nature may provide the advantage of controlling the stress of the film having the first chemical nature.

The substrate film and the chamber wall film may both have the same first chemical nature. This first chemical nature may be influenced by the constituents of the reaction gas mixture, the temperature and pressure, inside the process chamber, during provision of the reaction gas mixture and the temperature and pressure, inside the process chamber, during the processing of the substrate. The temperature and pressure inside the process chamber during the provision of the reaction gas mixture may, in embodiments, be different than those during the processing of the substrate. In other embodiments, the temperature and pressure inside the process chamber during the provision of the reaction gas mixture may be the same as those during the processing of the substrate.

Thus, in embodiments, modifying the upper portion may further comprise, before exposing the inner surfaces to the ambient, adjusting the pressure in the process chamber to atmospheric pressure. This may provide the advantage of being able to reduce the probability of particle formation in a process chamber comprised in a LPCVD furnace. It is to be noted in order to reduce the probability of particle formation in a process chamber comprised in another type of furnace, the pressure in the process chamber may be adjusted to higher than atmospheric pressure.

In embodiments, the ambient may comprise an oxidizing gas. This may provide the advantage of oxidizing the at least upper portion of the chamber wall film (20). When at least the upper portion of the chamber wall film (21) is oxidized when the pre-determined chamber wall film thickness (d) is reached, thus relieving stress in the chamber wall film (20) (FIG. 2(*b*)) in a controlled way, without substantial particle formation. Thus, as far as it comes down to the risk of particle formation, the effective chamber wall film thickness is effectively set to zero by exposing the chamber wall film to the oxidizing gas. The repetition of the processing step (510) one or more times results in further thickening chamber of the total wall film due to the newly formed chamber wall film (20) until the pre-determined chamber wall film thickness (d) is reached again (FIG. 2(*c*)). In other words, processing continues until a material formed on the chamber wall after exposing the chamber wall film to the oxidizing gas has reached the pre-determined thickness. This may then require exposure to the ambient again, which, in these embodiments, may be the oxidizing gas, thereby modifying, thus oxidizing, at least an upper portion of the newly formed chamber wall film having the pre-determined chamber wall film thickness (d) (FIG. 2(*d*)). This may lead to the presence of a chamber wall film on the inner surfaces having portions (22) of incremental thickness ($d_2$) that are laminated with the modified portions (21). After executing these repetitive processing steps for a pre-determined number of times, thereby forming the chamber wall film on the inner surfaces having portions (22) of incremental thickness ($d_2$) that are laminated with the oxidized portions (21), a preventive maintenance may be executed to clean the inner surfaces.

Avoiding further increase in the thickness of the chamber wall film (20) may provide the advantage of overcoming thickness-induced stress release of the chamber wall film that may play a role on the formation of particles.

Furthermore, this oxidized portion (21) of the chamber film may possess a stress value being different than that of the chamber wall film (20) itself. In embodiments, this stress value of the at least oxidized upper portion may be lower than that of the chamber wall film. Therefore, oxidation of the at least upper portion may not only hinder further increase in the thickness of the chamber wall film beyond the pre-determined chamber wall film thickness (d), but may also lead to the formation of a lower stress portion so that the probability of particle formation is reduced.

In embodiments, this oxidizing gas may comprise substantially elemental oxygen. The modification of at least the upper portion (21) of the chamber wall film (20) may then occur through dry oxidation. Dry oxidation may have the advantage of providing slow oxidation, thereby allowing for a better control of the thickness of the oxidized portion, which corresponds to the thickness of the modified upper portion (21) of the chamber wall film (20).

In alternative embodiments, the oxidizing gas may be oxygen gas and the ambient may further comprise water vapor, thereby leading to wet oxidization of the at least upper portion.

In embodiments, the exposure of the inner surfaces to the ambient may be done at a temperature in the range of 500° C. to 800° C. Exposing the inner surfaces to the ambient at a temperature in this range may be advantageous when the process chamber is comprised in a LPCVD furnace. In embodiments, where the process chamber may be comprised in a different type of furnace, the exposure of the inner surfaces to the ambient may be done at a temperature up to 1200° C. For example, exposing the inner surfaces to the ambient may be done at a temperature of at least 500° C. to at most 600° C., or at a temperature of at least 600° C. to at most 700° C., or at a temperature of at least 700° C. to at most 800° C., or at a temperature of at least 800° C. to at most 900° C., or at a temperature of at least 900° C. to at most 1000° C., or at a temperature of at least 1000° C. to at most 1100° C., or at a temperature of at least 1100° C. to at most 1200° C. In embodiments, the film may comprise a semiconductor material and wherein the provision of the reaction gas mixture may comprise providing a first reactant gas and a second reactant gas being different from the first reactant gas. The semiconductor material comprised in the film may be a Group IV semiconductor material. This Group IV semiconductor material may be silicon. In embodiments, the first reactant gas may comprise a silicon-containing compound and the second reactant gas may comprise a nitrogen-containing compound. This silicon-containing compound may, in embodiments, comprise a silane or a halo-silane. In embodiments, this silane may comprise a monosilane or a higher order silane. The higher order silane may, in embodiments, comprise at least one of disilane and trisilane.

In embodiments, the silicon-containing compound may comprise a halosilane. Suitable halosilanes include fluorosilanes, chlorosilanes, bromosilaens, and iodosilanes. In embodiments this halosilane may be a chlorosilane. In embodiments, this chlorosilane may be silicon tetrachloride, trichlorosilane or dichlorosilane.

In embodiments, the nitrogen-containing compound may comprise a nitrogen oxide. This nitrogen oxide may, in embodiments, be nitrous oxide.

In embodiments, the provision of the first reactant gas may be done at least partially simultaneously with the provision of the second reactant gas. This may provide the advantage of having the first reactant gas and the second reactant gas react simultaneously on the substrate surface to form the substrate film. In alternative embodiments, the first reactant gas and the second reactant gas may be provided into the process chamber sequentially.

In embodiments, the provision of the reactant gas mixture may further comprise providing a dopant precursor gas to the process chamber. This may lead to the formation of a doped substrate film on the substrate and a doped chamber wall film on the one or more inner surfaces. The presence of dopant in the film may help to tailor the conductivity of the film. In embodiments, this dopant precursor gas may comprise oxygen atoms.

In embodiments, the concentration of oxygen may be in the range of 2 atomic % to 50 atomic %, or 2 atomic % to 5 atomic %, 5 atomic % to 10 atomic %, 10 atomic % to 20 atomic %, or 20 atomic % to 50 atomic %. The atomic percentage in these embodiments may refer to the percentage of oxygen atoms based on the total atoms. In alternative embodiments, the atomic percentage may refer to the percentage of oxygen-containing molecules based on total amount of molecules. The provision of the dopant precursor gas comprising oxygen having concentration in this range may provide the advantage of forming a highly oxygen doped film.

In alternative embodiments, the dopant precursor gas may comprise a Group IIIA or a Group VA-containing compound. In embodiments, this Group IIIA-containing compound may comprise boron, aluminum, gallium or indium. In embodiments, the Group VA-containing compound may comprise phosphor, arsenic or antimony.

In embodiments, the provision of the dopant precursor may be done simultaneously with the provision of the reaction gas mixture. This may allow for simplification on the processing as it requires no extra process for doping and no further process is needed for doping adjustment.

In embodiments, the pre-determined chamber wall film thickness (d) of the chamber wall film (20) may at least be 2 μm. This pre-determined chamber wall film thickness value may provide the advantage of overcoming thickness-induced stress release.

It is to be noted that, the pre-determined chamber wall film thickness may need to be adjusted as a function of the substrate processing step. It may further be needed or desired to be adjusted depending on the type of dopants and their provision to the film since this may play a role on how the film crystallizes, thereby influencing the stress in the film. Therefore, this may require adjusting the pre-determined chamber wall film thickness (d) according to the substrate processing to be done, whereby different reaction gas mixtures may be provided at different process parameters and where different dopants may be used. This may be due to the fact that the stress in the film is influenced by the reaction gas mixture, the dopant type and dopant concentration and the process parameters used for their provision to the process chamber.

Therefore, depending on the type of reactant gases comprised in the reaction gas mixture and/or the dopant type and its concentration as well as the process parameters of the substrate processing step, the pre-determined chamber wall film thickness (d) may, in embodiments, be selected for avoiding thickness-induced stress release, thereby reducing the probability of particle formation in the process chamber. The selection of the process parameters of the substrate processing step may involve tuning at least the temperature and pressure, at which the reaction gas mixture is provided in the process chamber. It may further comprise tuning the provision of the reaction gas mixture.

In embodiments, this pre-determined chamber wall film thickness (d) of chamber wall film (20) after which exposure to an ambient is needed may be in a range from at least 2 µm to at most 20 µm or from at least 2 µm to at most 15 µm or from at least 2 µm to at most 10 µm. This may be advantageous in order to reduce the probability of particle formation.

In embodiments, the thickness of the modified upper portion may at least be 10 Å. In embodiments, the thickness of the modified upper portion may be from 1 nm to 300 nm, or from 1 nm to 2 nm, or from 2 nm to 5 nm, or from 5 nm to 10 nm, or from 10 nm to 20 nm, or from 20 nm to 50 nm, or from 50 nm to 100 nm, or from 100 nm to 200 nm, or from 200 nm to 300 nm.

It is also to be noted that, in embodiments, the thickness $(d_1)$ of the modified upper portion (21) may need to be adjusted in view of the chosen pre-determined chamber wall film thickness (d). The thickness $(d_1)$ of the modified upper portion (21) may be chosen such that build-up of the chamber wall film is interrupted upon reaching the pre-determined chamber wall film thickness (d) so that the stress in the chamber wall film can be compensated, thereby reducing the probability of particle formation.

In an exemplary embodiment, the processing of a semiconductor substrate may be performed in a CVD apparatus. The CVD apparatus can suitably be an LPCVD apparatus for processing a plurality of substrates. The plurality of substrates may be provided vertically in the process chamber comprised in this LPCVD apparatus. The first reactant gas comprised in the reactant gas mixture may be a monosilane, while the second reactant gas comprised in the reactant gas mixture may be nitrous oxide. The processing of the plurality of substrates may be done in the process chamber at a temperature in the range of 580° C. to 630° C. A dopant precursor gas comprising oxygen atoms may be provided simultaneously with the provision of this reaction gas mixture, thereby forming a doped substrate film on the plurality of substrates and forming a doped chamber wall film on the inner surfaces. The pressure in the process chamber may be about 600 mTorr. The doped substrate film formed on the plurality of substrates and the doped chamber wall film formed on the inner surfaces may thus, be a semi-insulating polycrystalline oxygen doped silicon film.

Figure 4:
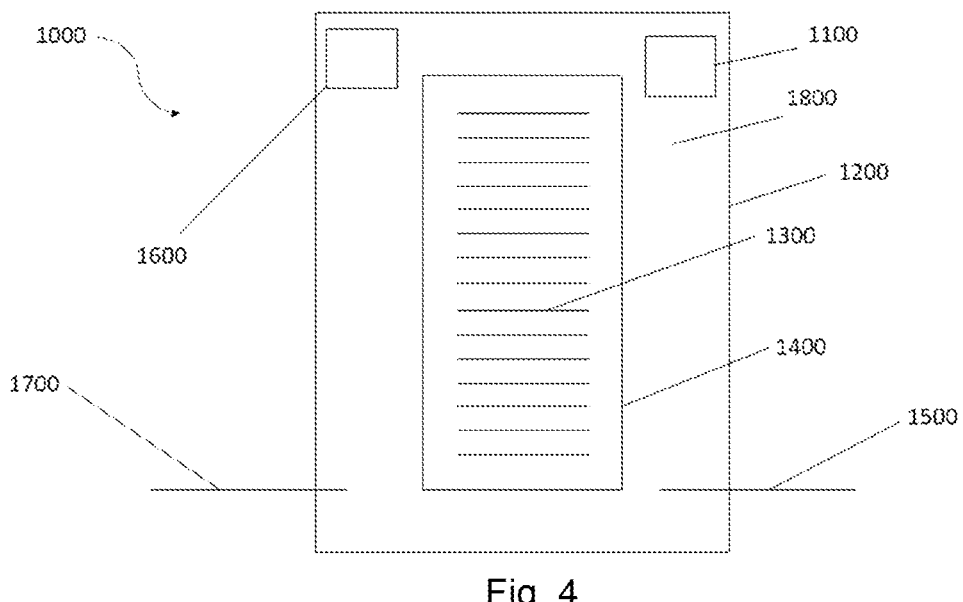
FIG. 4: shows a schematic representation of a wafer processing furnace according to embodiments of the second aspect of the present disclosure.

FIG. 4 shows a schematic representation of a wafer processing furnace (1000) according to embodiments of the second aspect of the present disclosure while FIG. 3 shows schematic representation of the chamber wall film on the one or more inner surfaces.

The wafer processing furnace (1000) may comprise a process chamber (1800) extending in a longitudinal direction and having one or more inner surfaces. A wafer boat (1400) may be comprised in the wafer processing furnace (1000), for holding a plurality of substrates (1300), whereby the plurality of substrates being longitudinally spaced apart. The wafer processing furnace (1000) may further comprise an inlet (1500) for providing a process gas into the process chamber (1800). The wafer processing furnace (1000) may further comprise an outlet (1700) for letting an exhaust gas, which is formed after processing is completed in the process chamber, out of the process chamber (1800).

In embodiments, the wafer processing furnace (1000) may comprise a plurality of inlets. The plurality of inlets may be configured for providing at least one of a precursor gas and a dopant precursor gas into the process chamber (1800). The plurality of inlets may thus provide the advantage of performing an in-situ doping while forming a substrate film. The plurality of inlets may further be configured for providing different precursor gases simultaneously or sequentially into the process chamber. Simultaneous provision of the precursor gases may allow for the precursor gases react simultaneously on the plurality of substrates, thereby forming the substrate film.

In embodiments, the dopant precursor gas may be provided in the presence of a carrier gas. The carrier gas may substantially comprise at least one of a noble gas, $H_2$, and $N_2$.

The one or more inner surfaces of the process chamber (1800) may comprise a chamber wall film, the chamber wall film comprising a bilayer (30). This bilayer has a first layer (22) comprising a semiconductor material and is overlaid by a second layer (21) comprising an oxide, thereby prolonging the preventive maintenance cycle. In embodiments, the second film (21) may be in direct contact with the first film (22).

Prolonging the preventive maintenance cycle may offer the advantage of improving throughput of processing by this wafer processing furnace. This may be due to the fact prolonged maintenance cycle leads to performing reduced preventive maintenance interruptions. This may then further provide the advantage of improving the overall throughput for the semiconductor manufacturing process as semiconductor processing involves interlinked processes to be performed.

In embodiments, the first layer (22) may have a first thickness $(d_2)$ and the second layer (21) may have a second thickness $(d_1)$ and the first thickness $(d_2)$ and the second thickness $(d_1)$ may be configured such that the probability of particle formation in the process chamber (1800) is reduced.

Reducing the probability of particle formation in this wafer processing furnace may provide the advantage of setting up a better preventive maintenance plan for this wafer processing furnace. This may help to increase the availability of this furnace, thereby keeping processing substantially continuous. This may further provide the advantage of reducing manufacturing costs as unexpected maintenance interruptions will be avoided. Unexpected maintenance interruptions may be a cause for increased resource allocation and increased tool down times, thus having a negative influence on the throughput of the processing.

In embodiments, the first thickness $(d_2)$ may be larger than the second thickness $(d_1)$ as schematically shown in FIG. 3. In alternative embodiments, the first thickness $(d_2)$ may be smaller than the second thickness $(d_1)$.

In embodiments, the thickness $(d_1)$ of the second layer (21) may be at least 10 Å.

In embodiments, a total thickness of the first layer (22) and the second layer (21) comprised in the bilayer (30) may together be at least 2 µm. In embodiments, this total thickness may be in a range from at least 2 µm to at most 20 µm or from at least 2 µm to at most 15 µm or from at least 2 µm to at most 10 µm. This may be advantageous in order to reduce the probability of particle formation.

In embodiments, the chamber wall film may comprise a plurality of bilayers (30) as schematically shown in FIG. 3. This may lead to the presence of a chamber wall film on the one or more inner surfaces of the process chamber (1800) having the second layer (21) having incremental thickness $(d_2)$ laminating the first layer (22). This may lead to the interruption of the thickness of the first layer (22) by the presence of the second layer (21), thereby leading to a reduction of the risk for the occurrence of thickness-induced stress release by the first layer (22). This may provide the advantage of performing fewer preventive maintenance cycles. Furthermore, it may provide the advantage of performing a better scheduled preventive maintenance, thereby reducing the risk for unplanned downtime of the wafer processing furnace (1000).

In embodiments, the first layer (22) may further comprise a dopant. The chamber wall film comprised on the one or more inner surfaces of the process chamber may be the same as the film that is formed on the plurality of substrates after a processing has been carried out. As dopants may be used to adjust the conductivity of the film formed on the substrates, the first layer of the chamber wall film may also comprise the dopant.

The dopant, in embodiments, may comprise oxygen atoms.

In embodiments, the semiconductor material may comprise a Group-IV semiconductor material. This Group-IV semiconductor material may, in embodiments, be silicon. In some embodiments, the chamber wall film may comprise more than one group IV element. This can occur, for example, when the reaction gas mixture used when processing the substrates comprises more than one group IV elements. In exemplary embodiments, the reaction gas mixture comprises a silicon precursor such as silane and a germanium precursor such as germane. Thus, in some embodiments, the chamber wall film can comprise, or can consist of, a silicon-germanium alloys.

In alternative embodiments, the semiconductor material may comprise a Group III-V semiconductor material. This can occur, for example, when the reaction gas mixture used when processing the substrates comprises a group IIIA element precursor such as a gallium precursor such as a gallium alkyl such as triethylgallium, and a group VA element precursor such as a group VA element hydride such as arsine. Thus, in some embodiments, the chamber wall film can comprise, or can consist of, a group III-V semiconductor such as GaAs. In some embodiments, the reaction gas mixture can comprise a further group IIIA element precursor such as an aluminum alkyl such as trimethylaluminum. Thus, in some embodiments, the chamber wall film can comprise, or can consist of, a ternary group III-V semiconductor such as AlGaAs.

In embodiments, the oxide may be an oxide of the semiconductor material. This may provide the advantage of providing a lower stress on the first layer (22). Having the lower stress may then have an advantage of delaying thickness-induced stress relief, thereby reducing the probability of particle formation from the first layer (22).

In exemplary embodiments where the Group-IV semiconductor material comprised in the semiconductor material of the first layer (22) is silicon, the oxide comprised in the second layer (21) may, thus be a silicon oxide. In these exemplary embodiments, the first layer may further be doped with oxygen atoms, thereby leading to the presence of a semi-insulating polycrystalline oxygen doped silicon (SI-POS) film making up the first layer (22) present on the one or more inner surfaces of the process chamber (1800).

In embodiments, the wafer processing furnace (1000) may further comprise a controller configured for causing the wafer processing furnace to execute a method as described herein. This may help the processing in the furnace to be run in an automated way. The wafer processing furnace may, in embodiments, further comprise a heater configured for heating the process chamber (1800). In processes carried out in the processing chamber (1800) of this furnace (1000), where temperature may be an important process parameter, presence of the heater helps to adjust the temperature. This wafer processing furnace (100) may, in embodiments, be a vertical furnace, as schematically represented in FIG. 4. Vertical furnaces provide the advantage of making efficient use of cleanroom space. This vertical furnace in embodiments, may be a CVD furnace.

The invention claimed is:

1. A method of particle abatement in a semiconductor processing apparatus, the method comprising:
   processing a substrate in a process chamber of the semiconductor processing apparatus comprising the steps of:
      loading the substrate in the process chamber, the process chamber having one or more inner surfaces;
      providing a reaction gas mixture to the process chamber, thereby forming a substrate film on the substrate and a chamber wall film on the one or more inner surfaces;
      loading the substrate out of the process chamber, thereby emptying the process chamber;
   repeating the processing one or more times until the chamber wall film has reached a pre-determined chamber wall film thickness; and
   when the chamber wall film has reached the pre-determined chamber wall film thickness, exposing the inner surfaces to an ambient, thereby modifying at least an upper portion of the chamber wall film, and
   wherein modifying the upper portion further comprises, before exposing the inner surfaces to the ambient, adjusting pressure in the process chamber to atmospheric pressure.

2. The method according to claim 1, wherein the repeating of the processing comprises increasing a thickness of the chamber wall film until it reaches the pre-determined chamber wall film thickness.

3. The method according to claim 1, wherein the ambient comprises an oxidizing gas.

4. The method according to claim 3, wherein the oxidizing gas comprises substantially elemental oxygen.

5. The method according to claim 1, wherein the exposing of the inner surfaces to the ambient is done at a temperature in a range of 500° C. to 800° C.

6. The method according to claim 1, wherein the substrate film and the chamber wall film comprise a semiconductor material and wherein the providing of the reaction gas mixture comprises providing a first reactant gas and a second reactant gas, the second reactant gas being different from the first reactant gas.

7. The method according to claim 6, wherein the first reactant gas comprises a silicon-containing compound and the second reactant gas comprises a nitrogen-containing compound.

8. The method according to claim 6, wherein the providing of the first reactant gas is done at least partially simultaneously with the providing of the second reactant gas.

9. The method according to claim 1, wherein the process chamber is comprised in a wafer processing apparatus for processing a plurality of substrates arranged in a wafer boat.

10. The method according to claim 9, wherein the wafer processing apparatus is a vertical furnace.

11. A method of particle abatement in a semiconductor processing apparatus, the method comprising:
   processing a substrate in a process chamber of the semiconductor processing apparatus comprising the steps of:
      loading the substrate in the process chamber, the process chamber having one or more inner surfaces;

providing a reaction gas mixture to the process chamber, thereby forming a substrate film on the substrate and a chamber wall film on the one or more inner surfaces;

loading the substrate out of the process chamber, thereby emptying the process chamber;

repeating the processing one or more times until the chamber wall film has reached a pre-determined chamber wall film thickness; and when the chamber wall film has reached the pre-determined chamber wall film thickness, exposing the inner surfaces to an ambient, thereby modifying at least an upper portion of the chamber wall film, and wherein the substrate film and the chamber wall film have a first chemical nature and wherein the modified upper portion of the chamber wall film has a second chemical nature, the second chemical nature being different than the first chemical nature.

12. The method according to claim 11, wherein modifying the upper portion further comprises, before exposing the inner surfaces to the ambient, adjusting pressure in the process chamber to atmospheric pressure.

13. The method according to claim 11, wherein the ambient comprises an oxidizing gas.

14. The method according to claim 13, wherein the oxidizing gas comprises substantially elemental oxygen.

15. The method according to claim 11, wherein the exposing of the inner surfaces to the ambient is done at a temperature in a range of 500° C. to 800° C.

16. The method according to claim 11, wherein the substrate film and the chamber wall film comprise a semiconductor material and wherein the providing of the reaction gas mixture comprises providing a first reactant gas and a second reactant gas, the second reactant gas being different from the first reactant gas.

17. A method of particle abatement in a semiconductor processing apparatus, the method comprising:

processing a substrate in a process chamber of the semiconductor processing apparatus comprising the steps of:

loading the substrate in the process chamber, the process chamber having one or more inner surfaces;

providing a reaction gas mixture to the process chamber, thereby forming a substrate film on the substrate and a chamber wall film on the one or more inner surfaces;

loading the substrate out of the process chamber, thereby emptying the process chamber;

repeating the processing one or more times until the chamber wall film has reached a pre-determined chamber wall film thickness; and when the chamber wall film has reached the pre-determined chamber wall film thickness, exposing the inner surfaces to an ambient, thereby modifying at least an upper portion of the chamber wall film, and wherein the providing of the reaction gas mixture further comprises providing a dopant precursor gas to the process chamber.

18. The method according to claim 17, wherein the providing of the dopant precursor gas is done simultaneously with the providing of the reaction gas mixture.

19. The method according to claim 17, wherein the dopant precursor gas comprises oxygen atoms.

20. The method according to claim 19, wherein the oxygen concentration is in a range of 2 atomic % to 50 atomic %.

* * * * *